(12) United States Patent
Liskow

(10) Patent No.: US 10,237,979 B2
(45) Date of Patent: Mar. 19, 2019

(54) ELECTRONIC MODULE WITH A COMPONENT WHICH CAN BE FLEXIBLY PLACED BY MEANS OF A BASE ELEMENT, AND METHOD FOR PRODUCING SAME

(71) Applicant: Robert Bosch GmbH, Stuttgart (DE)

(72) Inventor: Uwe Liskow, Asperg (DE)

(73) Assignee: Robert Bosch GmbH, Stuttgart (DE)

( * ) Notice: Subject to any disclaimer, the term of this patent is extended or adjusted under 35 U.S.C. 154(b) by 0 days.

(21) Appl. No.: 15/736,749

(22) PCT Filed: Jun. 6, 2016

(86) PCT No.: PCT/EP2016/062802
§ 371 (c)(1),
(2) Date: Dec. 14, 2017

(87) PCT Pub. No.: WO2017/016725
PCT Pub. Date: Feb. 2, 2017

(65) Prior Publication Data
US 2018/0177058 A1 Jun. 21, 2018

(30) Foreign Application Priority Data
Jul. 29, 2015 (DE) .......... 10 2015 214 311

(51) Int. Cl.
*H05K 1/14* (2006.01)
*H05K 3/28* (2006.01)
(Continued)

(52) U.S. Cl.
CPC ............ *H05K 3/284* (2013.01); *H05K 1/111* (2013.01); *H05K 1/181* (2013.01); *H05K 3/301* (2013.01);
(Continued)

(58) Field of Classification Search
CPC ........ H05K 3/284; H05K 3/301; H05K 3/328; H05K 5/0082; H05K 5/065; H05K 1/111; H05K 1/181
(Continued)

(56) References Cited

U.S. PATENT DOCUMENTS 4,703,397 A * 10/1987 Minoura ............. B60R 16/0239
361/752
5,105,262 A * 4/1992 Grider ................... G01L 19/142
174/520
(Continued)

FOREIGN PATENT DOCUMENTS

DE 10 2013 215 368 A1 2/2015
EP 0 855 851 A2 7/1998
(Continued)

OTHER PUBLICATIONS

International Search Report corresponding to PCT Application No. PCT/EP2016/062802, dated Sep. 13, 2016 (German and English language document) (5 pages).

*Primary Examiner* — Hung S. Bui
(74) *Attorney, Agent, or Firm* — Maginot, Moore & Beck LLP

(57) ABSTRACT

An electronic module includes a circuit board, a first component, and a socket element with a first surface and a second surface opposite the first surface. The first surface lies on a surface of the circuit board and is fixed to the circuit board. A second component is secured to the socket element and is electrically connected to the circuit board via the socket element. A protective compound is arranged on the surface of the circuit board and encapsulates the first component. The socket element is partly embedded into the protective compound such that lateral flanks of the socket element are covered by the protective compound, and the second surface of the socket element protrudes out of the
(Continued)

protective compound. Connection elements of the socket element and connections of the second component are connected via a welding connection. Second components are attachable to the circuit board in a reliable manner.

15 Claims, 3 Drawing Sheets

(51) Int. Cl.
| | |
|---|---|
| *H05K 3/30* | (2006.01) |
| *H05K 3/32* | (2006.01) |
| *H05K 5/00* | (2006.01) |
| *H05K 1/11* | (2006.01) |
| *H05K 1/18* | (2006.01) |
| *H05K 5/06* | (2006.01) |

(52) U.S. Cl.
CPC ........... *H05K 3/328* (2013.01); *H05K 5/0082* (2013.01); *H05K 5/065* (2013.01); *H05K 2201/105* (2013.01); *H05K 2201/10151* (2013.01); *H05K 2201/10189* (2013.01); *H05K 2201/10522* (2013.01); *H05K 2201/10606* (2013.01); *H05K 2201/2072* (2013.01); *H05K 2203/1316* (2013.01); *H05K 2203/1327* (2013.01)

(58) Field of Classification Search
USPC .......................................... 361/736
See application file for complete search history.

(56) References Cited

U.S. PATENT DOCUMENTS

| | | | | |
|---|---|---|---|---|
| 5,943,913 | A * | 8/1999 | Fenelon | F16H 55/14 |
| | | | | 192/209 |
| 5,982,624 | A * | 11/1999 | Onoda | G06K 19/07743 |
| | | | | 235/492 |
| 6,049,163 | A * | 4/2000 | Masuda | H01F 27/06 |
| | | | | 313/318.12 |
| 6,244,877 | B1 * | 6/2001 | Asao | H01R 9/2466 |
| | | | | 361/760 |
| 7,149,089 | B2 * | 12/2006 | Blasko | H01R 13/521 |
| | | | | 361/752 |
| 9,661,773 | B2 * | 5/2017 | Mijac | H05K 5/0056 |
| 2012/0077356 | A1 * | 3/2012 | Shimizu | H01G 2/06 |
| | | | | 439/55 |

FOREIGN PATENT DOCUMENTS

| | | |
|---|---|---|
| EP | 1 424 708 A1 | 6/2004 |
| JP | H11-97617 A | 4/1999 |

* cited by examiner

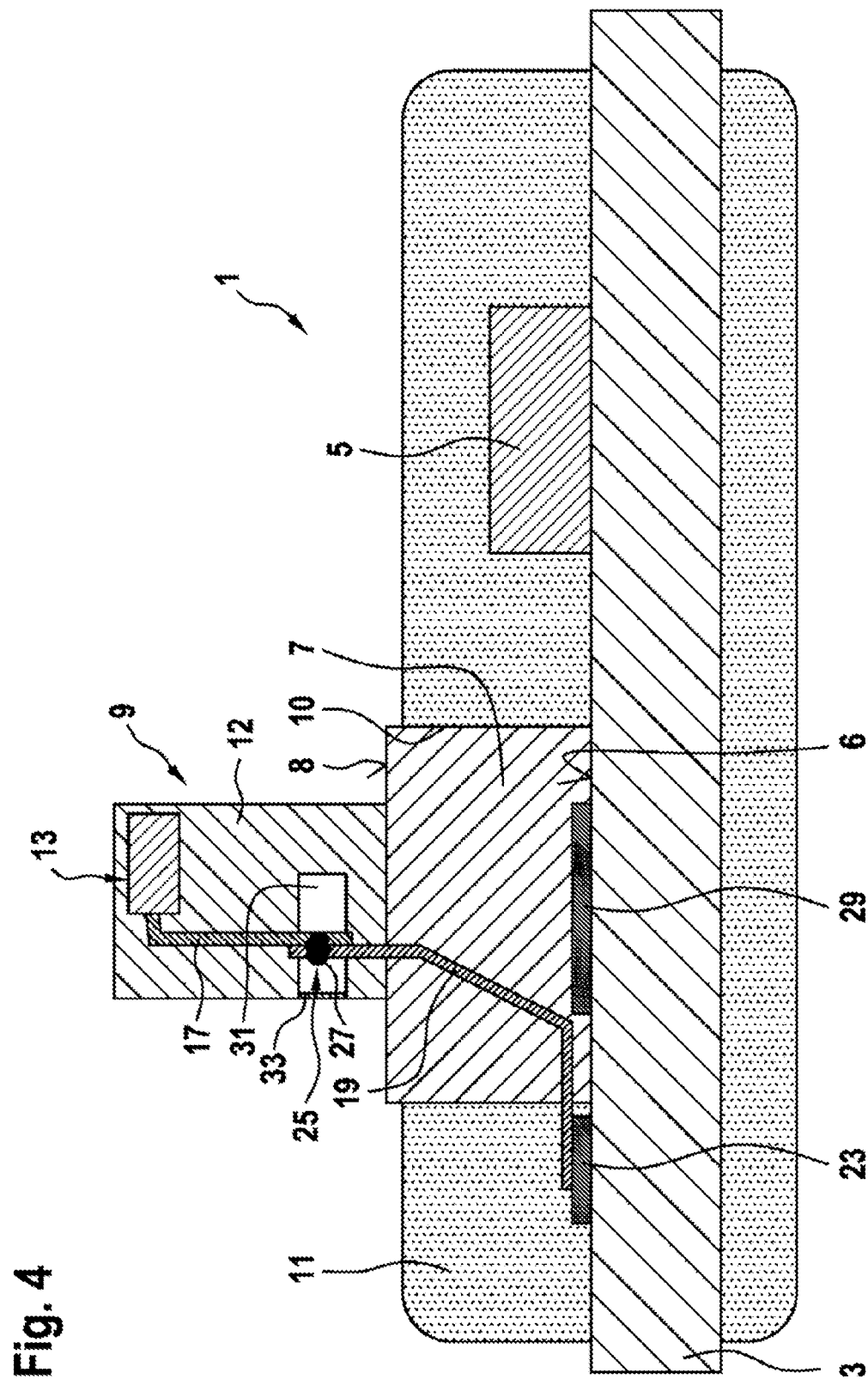

ELECTRONIC MODULE WITH A COMPONENT WHICH CAN BE FLEXIBLY PLACED BY MEANS OF A BASE ELEMENT, AND METHOD FOR PRODUCING SAME

This application is a 35 U.S.C. § 371 National Stage Application of PCT/EP2016/062802, filed on Jun. 6, 2016, which claims the benefit of priority to Serial No. DE 10 2015 214 311.2, filed on Jul. 29, 2015 in Germany, the disclosures of which are incorporated herein by reference in their entirety.

BACKGROUND

The present disclosure relates to an electronic module, such as for example can be used as a transmission control module for a motor vehicle. The disclosure furthermore relates to a method for producing an electronic module.

Electronic modules are used to construct circuits in which various electrical and/or electronic components are interconnected. With the aid of such interconnected components, the electronic module can provide particular functionalities. For example, electronic modules in the form of transmission control modules are used to control functions of a transmission in a motor vehicle. Besides simple components, for example resistors, capacitors, inductors, etc., or other more complex components, for example integrated circuits (ICs) or application-specific ICs (ASICs), an electronic module can in this case also have sensors, in order for example to measure states inside the transmission to be controlled or in an environment, and/or plugs, in order for example to be able to electrically connect the electronic module or portions thereof to external circuits.

Some components of an electronic module must be externally accessible, or able to detect ambient conditions, during its operation. For example, sensors are intended to be fitted on an electronic module in such a way that at least one sensing region of a sensor can interact with ambient conditions to be detected. Plugs of an electronic module should be externally accessible.

Furthermore, some components, such as in particular sensors and plugs, are intended to be electrically connected electrically to the other components, or to a circuit board carrying these other components, in such a way that significant forces acting on them during operation of the electronic module do not cause damage to the electrical connections in the long term. In particular, conventional solder connections can entail a risk of mechanical failure in the course of the lifetime of the electronic module.

DE 10 2013 215 368 A1 describes an electronic unit having a circuit board, on which a sensor is fastened.

SUMMARY

Embodiments of the present disclosure can advantageously provide an electronic module in which components, such as in particular sensors or plugs, can be fastened reliably and stably in the long term on a circuit board. In particular, a mechanical and electrical connection of such components to a circuit board can be carried out in a way in which it can be carried out straightforwardly with industrially established production processes, and/or positioning of a component to be fitted on the circuit board can be implemented with relatively little outlay and within a short time in the event of a required design change.

According to a first aspect of the disclosure, an electronic module is described, which comprises a circuit board, at least one first component, at least one base element, at least one second component and a protective compound. The first component is arranged on a surface of the circuit board and fastened thereon. The base element has a first surface and a second surface opposite the latter, and is arranged with its first surface lying on the surface of the circuit board and fastened thereon. The second component is fastened on the base element and is electrically connected via the latter to the circuit board. The protective compound is arranged on the surface of the circuit board and encapsulates the first component. The electronic module is distinguished in that the base element is partially embedded in the protective compound in such a way that lateral faces of the base element are covered by the protective compound and the second surface of the base element protrudes in an exposed fashion from the protective compound.

According to a second aspect of the disclosure, a method for producing an electronic module is described, which comprises the following steps: firstly, a circuit board is provided. At least one first component is arranged on a surface of the circuit board. Furthermore, at least one base element is arranged with its first surface on the surface of the circuit board. A second component is arranged on the base element. The first component is embedded into a protective compound in such a way that the first component is encapsulated in the protective compound. The method is distinguished in that, with the embedding of the first component, the base element is also partially embedded in the protective compound in such a way that lateral faces of the base element are covered by the protective compound and the second surface of the base element protrudes in an exposed fashion from the protective compound. The second component is in this case preferably not arranged on the base element until after the application and optionally cross-linking of the protective compound.

Concepts regarding embodiments of the present disclosure can, inter alia, be regarded as based on the ideas and discoveries described below.

As described below with the aid of an example, in conventional electronic modules, sensors and/or plugs are often fastened on a circuit board with the aid of carrier plates. The carrier plates, which are intended to optionally absorb sometimes relatively high forces exerted by the sensor or plug, and at the same time are intended to connect the sensor or plug reliably with electrical connections to other components, which are provided for example on a circuit board, can be mechanically fastened reliably inside the electronic module for example by screws or rivet connections. Pins protruding from a sensor or plug can fit into circuit boards or flex films and be electrically connected thereto in particular by through-hole solder contacts (THT contacts) or welded or soldered to continuing lead frames. These circuit boards, flex films or lead frames can connect the sensor or plug to, for example, a central transmission control unit (iTCU) or a transmission plug.

However, positions of the sensors or plugs are at present generally specified rigidly in this case, which results in particular from a fixed configuration of the circuit boards, lead frames and flex films. If, for example, a design of an electronic module is intended to be modified, it can be necessary to reposition sensors or plugs on circuit boards. To date, however, this can often be unsuccessful because of fastening screws or rivets used for fastening the associated carrier plate, which for example require areas and free space on the circuit board and the carrier plate.

A solution has therefore been sought to refine and produce an electronic module, in particular for use as a transmission control module, in such a way that, for example for a case in which a design modification or variant creation of the electronic module is intended to be carried out, a position of particular components, in particular sensors or plugs, on a circuit board of the electronic module can be adapted in a straightforward way.

Embodiments of the electronic module proposed herein, or of the production method described herein, can satisfy such a requirement. In this case, the sensors or plugs can advantageously not be mounted and contacted until after production of electronics, while in particular being fixed very stably on the module. Furthermore, optimal protection against swarf and/or chemical attacks, for example at connection positions, can be made possible.

It is proposed to fasten a second component, for example a sensor, a plug or a further module with terminal contacts, on a circuit board via a base element, wherein the base element are however not necessarily held, like the carrier plates described above, on the circuit board by means of screw connections or rivet connections.

Instead, the base element is intended to be jointly embedded in a protective compound, which is arranged on the surface of the circuit board and is intended to encapsulate other components there. Yet while the other components are intended to be fully encapsulated, that is to say intended to be integrated into the protective compound in such a way and preferably covered fully by the latter that they are protected against external influences, for example externally acting chemicals, the base element is merely intended to be embedded in the protective compound in such a way that, although lateral faces of the base element are covered by the protective compound, the base element is however not fully encapsulated in the protective compound, but instead its second surface protrudes in an exposed fashion from the protective compound. In other words, although the protective compound is intended to laterally enclose the base element and stabilize the base element on the circuit board by mechanical bearing on the lateral faces of the base element, the protective compound is however not intended to fully cover the base element, so that at least the second surface of the base element remains free of protective compound and therefore remains externally accessible.

The protective compound can for example be a coating, a molding compound, an encapsulation compound or resin, in particular consisting of a thermosetting material. For example, the protective compound can be a coating or a resin based on epoxy, or a compound based on a thermosetting polyester, such as is often used for potting and encapsulating electrical components. Such coatings, resins, molding compounds or encapsulation compounds can be fluid during processing, and subsequently cured thermally or by a radiation energy.

In particular, the protective compound for embedding the base element and the first component can be applied by means of a dispensing process. In such a dispensing process, a fluid substance to be processed is applied, that is to say for example applied dropwise, onto a surface, that is to say in the present case onto the surface of the circuit board, and optionally distributed into desired regions, in order to then subsequently be cured. One advantage of such a dispensing process is, inter alia, that no elaborate tools are needed.

In principle, application and shaping of the protective compound with the aid of injection molding and molding could also be envisioned. This, however, would require a significantly greater outlay, for example for complex injection-molding or molding tools, and would also lead to an additional outlay in the event of a desired modification of positions of the parts or of the base element on the circuit board.

The base element can be a part which is surface-mounted on the circuit board. In other words, the base element can be configured in such a way that it can be fitted on the circuit board, and electrically connected thereto, using conventional SMD (surface mounted device) technology. Such surface-mounted application can allow a reliable mechanical as well as electrical connection between the base element and the circuit board. Furthermore, for example, it is possible to avoid through-hole solder contact on an opposite side of the circuit board protruding from its surface and possibly needing to be protected.

According to one embodiment, the second component, that is to say for example the sensor or plug, can have electrical terminals. The base element can have electrical terminal elements which are electrically connected to electrically conductive structures on the circuit board. The electrical terminals of the second component are in this case electrically connected to the electrical terminal elements of the base element. Overall, the second component can therefore be electrically connected to electrically conductive structures of the circuit board via the base element and its terminal elements.

The terminal elements of the base element can in this case advantageously be connected, in particular soldered, to the circuit board by SMD technology or in another way to corresponding terminal areas. Parts of the terminal elements can, for example, be lead out from a plastic block forming a body of the base element, so that they can be connected there to the terminals of the second component. The terminal elements can be metallic, for example in the form of stamped conductive plates. They can furthermore be embedded in a plastic forming the block of the sensor element. The block can, for example, be cuboid.

Advantageously, the electrical terminals of the second component can be welded to the electrical terminal elements of the base element. For example, laser welding or resistance welding can be used for this purpose. A welded connection between the electrical terminals of the second component and the electrical terminal elements of the base element can allow a very reliable electrical connection as well as a long-term resilient mechanical connection between these component parts. In particular, laser welding allows a flexible way, which is adaptable to spatial conditions, of carrying out welding operations.

As an alternative, said component parts can also be connected to one another by other connection methods, for example soldering, in particular ball soldering or laser soldering.

A connection position, at which the electrical terminals are connected to the electrical terminal elements, can be encapsulated. Such encapsulation can be used to protect the connection position against an effect of external influences, in particular against an effect of chemicals, for example transmission fluid. The encapsulation can be configured to be hermetically sealed, so that no chemicals can reach the connection position. The encapsulation can, for example, comprise a protective coating or resin, which is applied in the liquid state over the connection position, optionally distributed there and subsequently cured. As an alternative, the encapsulation can, for example, be carried out with the aid of a sealing protective cap.

The base element and the second electrical component can be mechanically fastened to one another irreversibly, in particular by adhesive bonding, hot caulking and/or compression connection. Such irreversible fastening can mean that the base element and the second electrical component can no longer be separated from one another without damage. For example, the second component can be connected to the base element by a contact surface between these two elements being provided with an adhesive which is subsequently cured. As an alternative, subregions of the two elements, or of one of the two elements, can temporarily be heated in order then to hot-caulk the two elements, so that they are firmly connected to one another after cooling. As another alternative, parts of the base element can be pressed together with parts of the second component in such a way that an irreversible connection between the two is formed. Such irreversible fastening can be stable in the long term, so that the second component can be held reliably on the circuit board even over long periods of time and despite significant forces acting on it.

According to one embodiment, the first component and the base element have sizes such that they can be fitted on the circuit board by means of one and the same applicator machine. In other words, the base element should not be substantially larger than the first component, which is otherwise to be arranged on the circuit board, so that it can be fitted on the circuit board with an applicator machine in the same way as these components. For example, the applicator machine in this case can grip a component or, alternatively, a base element, place it at a suitable position on the circuit board and fasten it thereon, for example by using SMD technology. The base element should for example be no more than 100%, preferably no more than 50%, and more preferably no more than 20%, greater than a first component to be arranged on the circuit board, in particular than the largest first component to be arranged on the circuit board. For example, the base element should not have a first surface, serving as a bottom surface, which is for example larger than 20 cm². For example, the base element should have a bottom surface of typically less than 2×2 cm². A base for a rotation speed sensor has, for example, a conventional bottom surface of 15×15 mm². It is, however, also possible to fit a base for a long contact strip, so as to fasten for example 20 conductive plates for a plug thereon, such a base having for example a bottom surface of 10×150 mm². During a production process, both the first component and the base element, or a plurality of base elements, can therefore be fitted onto the circuit board in a common application process and with a common applicator machine.

It is to be pointed out that some of the possible features and advantages of the disclosure are described herein with reference to different embodiments, in particular sometimes with reference to an electronic module and sometimes with reference to a method for producing an electronic module. A person skilled in the art recognizes that the features can be suitably combined, adapted or interchanged in order to obtain further embodiments of the disclosure.

BRIEF DESCRIPTION OF THE DRAWINGS

Embodiments of the disclosure will be described below with reference to the appended drawings; neither the drawings nor the description are to be interpreted as restricting the disclosure.

FIG. 4 shows an electronic module according to another embodiment of the present disclosure.

The figures are merely schematic and not true to scale. In the figures, reference signs which are the same denote features which are the same or have the same effect.

DETAILED DESCRIPTION

Figure 1:
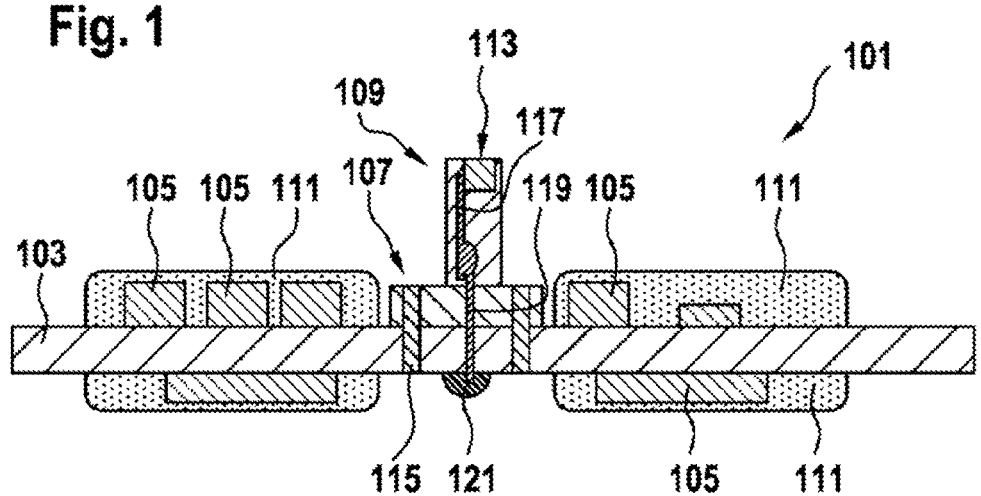
FIG. 1 shows a conventional electronic module.

FIG. 1 shows an example of a conventional electronic module 101, as can be used for example as a transmission control module. A plurality of electrical and electronic components 105 are provided on a circuit board 103, both on a front side and on a rear side. Furthermore, a second type of component in the form of a sensor 109 is provided. The sensor 109 is held on the circuit board 103 by means of a flange 107. The flange 107 is mechanically fixed to the circuit board 103 by means of screws or rivets 115. The flange 107 furthermore has at least one conductive plate 119, which is received in a through-bore of the circuit board 103 and therefore extends from the front side of the circuit board 103, on which the flange 107 is arranged, as far as the rear side of the circuit board 103 and is electrically connected in the form of a through-hole solder contact to conductive structures on the circuit board 103. The conductive plate 119 is fitted into a matching opening in a sensor dome of the sensor 109 and is electrically connected, for example by a solder connection, to metal contacts 117 located there. A sensor IC 113 is arranged on a top end of the sensor 109 and forms its sensing element. The sensor IC 113 is therefore electrically connected to the circuit board 103 via the contacts 117 and conductive plates 119. The components 105 are encapsulated with the aid of a protective compound 111. In this case, however, the protective compound does not cover the flange 107, but instead ends next to it. On a rear side of the circuit board 103, a drop 121 of coating protects a part of the through-hole solder contact protruding there.

In such an electronic module 101, the position of the sensor 109 can be modified at best with great outlay. A design modification or reconfiguration of the circuit board 103 would, inter alia, require that positions of the fastening screws or fastening rivets 115 have to be modified both on the circuit board 113 and possibly on the flange 107. Free space provided therefor on the circuit board and/or the carrier plate would also need to be adapted. According to experience, for such extensive design modifications, particularly in complex electronic modules in which, inter alia, lead frame modules, modules made of plastic carrier plates and/or flex films are possibly used, long lead times of up to 12 months are needed for their implementation.

Furthermore, during the production of conventional electronic modules, such as are described by way of example with reference to FIG. 1, the complete sensors 109 are usually already equipped with associated electronics and connected thereto, even though these are not components which fit into applicator machines. In addition or as an alternative, during the encapsulation process or coating process for forming the protective compound 111, free surfaces, in which the sensors 109 can subsequently be placed, fastened and contacted, typically need to be reserved on the circuit board 103. This is costly and requires significant installation space.

Furthermore, in the electronic module 101 represented in FIG. 1, electrical contacting methods are used, for example pin-in-hole soldering or THT (through-hole technology) soldering, in a selective soldering process. These can involve soldering pins protruding from the circuit board 103 and needing to be additionally protected against short circuits or the like, optionally in addition to protection on the upper side of the circuit board 103.

Figure 2:
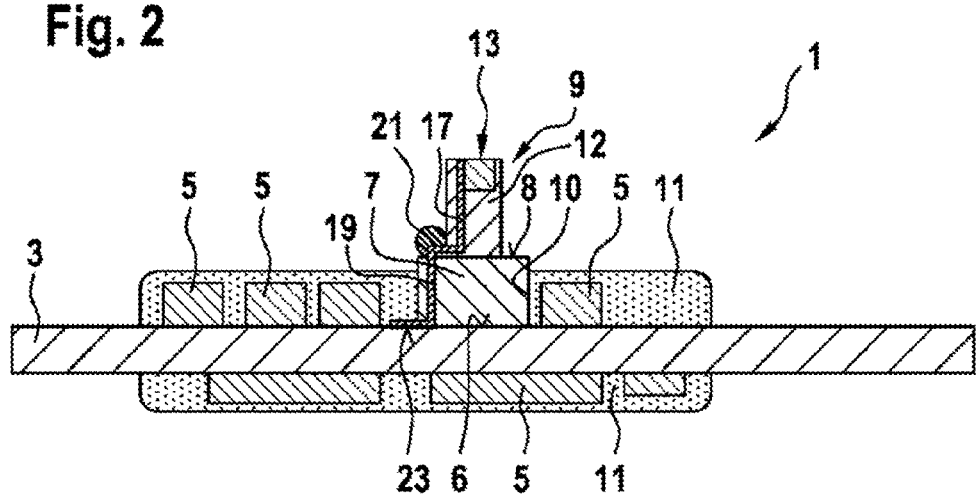
FIG. 2 shows an electronic module according to one embodiment of the present disclosure.
Figure 3:
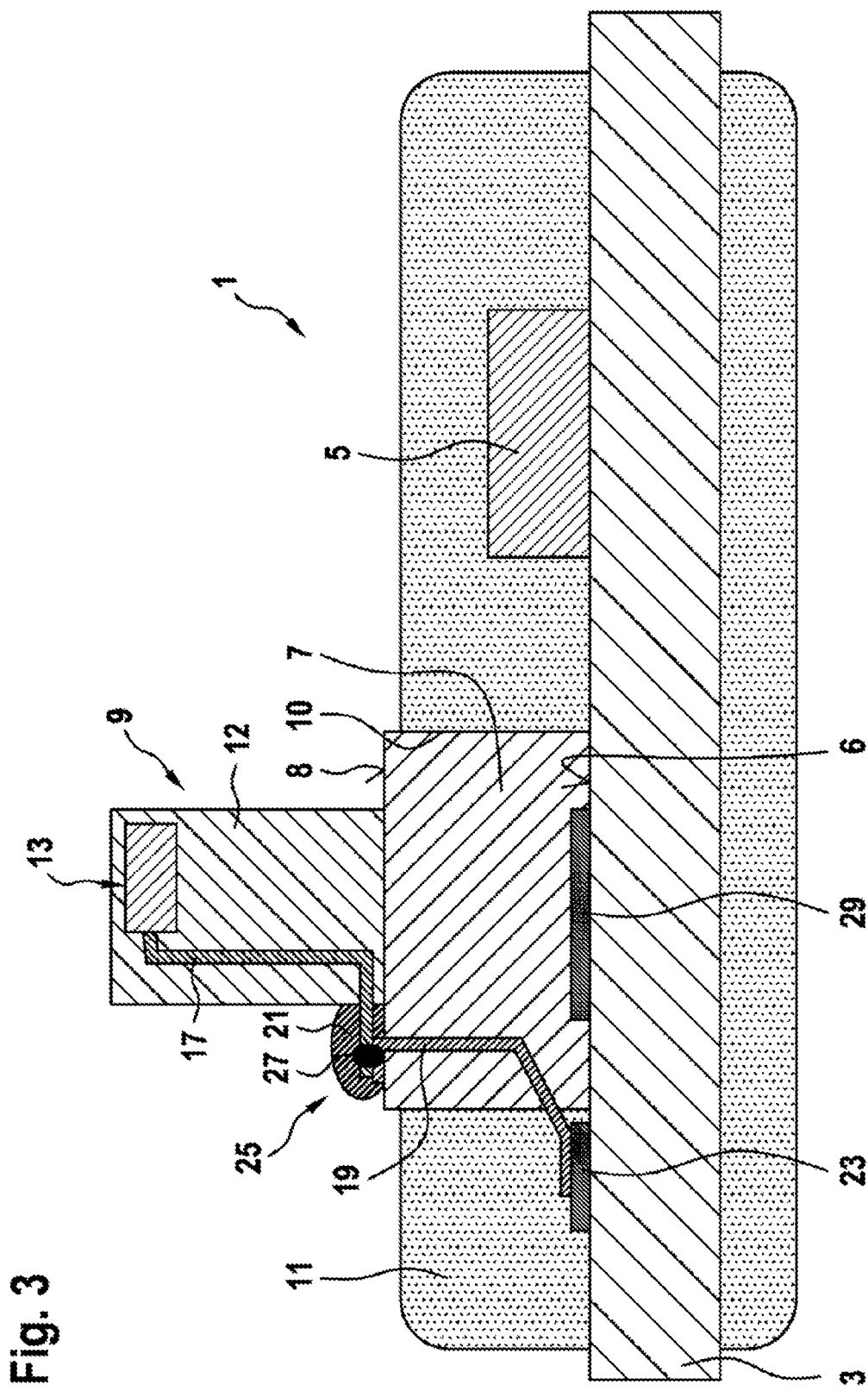
FIG. 3 shows an enlarged view of parts of the electronic module of FIG. 2.

An electronic module 1 as shall be described below by way of example with the aid of the embodiments represented in FIGS. 2, 3 and 4 is therefore proposed.

The electronic module 1 has a circuit board 3, on which at least one, preferably a plurality of first components 5 are provided, optionally on both the front and the rear surface. The electrical or electronic components 5 can be fitted onto the circuit board 3 in any desired fashion, preferably in a surface-mounted (SMD) fashion.

A base element 7, which has a first surface 6 and a second surface 8 arranged opposite the latter, is furthermore provided on the surface of the circuit board 3. The first and second surfaces 6, 8 can be parallel to one another, although they can also be in a different arrangement with respect to one another. That is to say, for example, the second surface 8 can also lie obliquely with respect to the first surface 6. In particular, the second surface 8 can be planar or curved. With its first surface 6, the base element 7 lies on the surface of the circuit board 3. Optionally, the base element 7 can be soldered, preferably in a surface-mounted fashion, to the surface of the circuit board 3 by means of a soldering surface 29 (see FIG. 3). The base element 7 can in this case comprise a for example cuboid body made of a nonconductive material, such as for example a thermoset, such as for example epoxy resin. Formed in this body are electrical terminal elements 19, for example in the form of stamped metal plates. Ends of these terminal elements 19 protrude outward beyond the body of the base element 7, and can therefore be externally contacted. For example, a lower end of a terminal element 19 can adjoin a solder pad 23 on the surface of the circuit board 3 and be soldered to this solder pad. An upper end of a terminal element 19 can protrude upward beyond the body of the base element 7 and therefore beyond the second surface 8 of the base element 7.

The base element 7 is in this case configured to be sufficiently small and in a manner such that it can be fitted onto the circuit board 3 in a similar way to the first electrical components 5 with the aid of an applicator machine. In this case, the applicator machine can position the base element 7 at a suitable position on the circuit board 3 and optionally solder it thereto, in order to produce electrical and/or mechanical connections.

After both the electrical first components 5 and the base element 7 have been fitted onto the circuit board 3, a protective compound 11, for example in the form of a coating or a resin, is applied onto one or both surfaces of the circuit board 3. For example, the protective compound 11 can be applied in the scope of a dispensing process in which the protective compound in the fluid state is, for example, applied dropwise onto the surfaces to be protected of the circuit board 3, and at the same time or subsequently distributed over desired regions. The protective compound 11 in this case covers the first components 5 fully, so that these are encapsulated and therefore protected against environmental influences, and received between the protective compound 11 and the circuit board 3. At the same time, the liquid protective compound 11 also flows around the base element 7. The base element 7, however, is configured with a greater height than the components 5, so that although the protective compound 11 encloses lateral faces 10 of the base element 7 and therefore embeds the base element 7 within it, it does not however cover the second, upper surface 8 of the base element 7. At its upper second surface 8, the base element 7 therefore protrudes upward beyond the protective compound 11, and is therefore freely uncovered. In a subsequent step, the protective compound 11 can be cured, for example thermally or by radiation energy. The base element 7 is then embedded in the cured protective compound 11 and is mechanically fastened very stably by means of its bottom surface and its lateral faces. In particular, the connection between the base element 7 and the circuit board 3, that is to say for example the electrical connection between the terminal element 19 and the solder pad 23, as well as the mechanical connection by means of the surface-mounted soldering 29 to the lower side of the base element 7, are fully protected by the protective compound 11.

In a subsequent production step, that is to say for example in a subsequent assembly line, the electronics prepared in the way with the equipped circuit board 3 can be fitted with second components 9, for example a sensor or a plug. The second component 9 can in this case comprise, for example, a cuboid or cylindrical body 12, which consists for example of a plastic compound, in particular a thermosetting compound. Electrical or electronic parts, for example a sensor cell 13, for example in the form of an IC or an ASIC, can be embedded in this body 12. These parts can, for example, be molded or injection-molded firmly into the thermoset of the body 12. Original terminal pins, which can form electrical terminals 17 of the second component 9, can in the ideal case protrude below or on the edge of the body 12 without further extension.

As can be seen clearly in FIG. 3, the parts of the terminals 17 protruding beyond the sensor body 12 can subsequently be electrically connected to the parts of the terminal elements 19 protruding beyond the body of the base element 7, for example by being welded at a connection position 25 so as to form a weld position 27 serving as an electrical contact. Such welding allows a long-term reliable electrical connection of the second component 9 via the base element 7 to electrically conductive structures of the circuit board 3.

Subsequently, the connection position 25 can be encapsulated, in order to protect it for example against environmental influences such as an attack by chemicals, in particular transmission fluid. To this end, for example, a further protective compound 21 in the form of a coating or a resin can be dispensed over the connection position 25 and subsequently cured, as is represented in the embodiment of FIG. 3.

As an alternative, as represented in FIG. 4, an upwardly protruding end of a terminal element 19 of the base element 7 can be inserted into a suitably dimensioned recess in the sensor body 12. Furthermore provided in the sensor body 12 is an initially outwardly open opening 31, for example in the form of a blind hole. In the region of this opening 31, the end of the terminal element 19 and an end of a terminal 17 of the second component 9 can overlap one another and be connected to one another at a connection position 25 by a weld 27. Subsequently, the opening 31 can be closed, for example with the aid of a cap 33, and therefore encapsulated.

In order also to connect the second component 9 mechanically firmly to the base element 7, these can be for example adhesively bonded or hot-caulked to one another, held against one another by means of a compression connection, or mechanically connected to one another in another way.

Embodiments of the electronic module described herein, and of the method for producing such an electronic module 1, can offer several advantages. For example, design modifications on the circuit board 3 can be implemented simply and rapidly, for example within just 2 months. Second components 9 in the form of, for example, sensors or plugs can be fixed very stably on the module 1, or on its circuit board 3. Furthermore, all critical positions, in particular connection positions 25, can be protected optimally against, for example, swarf or chemical attack. Standard sensor domes, for example from a modular system, can be used, in which case such standardized parts can have standardized interfaces. A variance of the second parts 9, in particular of sensors, can lie in the base element 7, for example as a result of base elements 7 of different height or oblique surfaces on the base element 7.

Lastly, it should be pointed out that terms such as "having", "comprising", etc. do not exclude other elements or steps, and terms such as "a/an" or "one" do not exclude a plurality. References in the claims are not to be regarded as restrictive.

The invention claimed is:

1. An electronic module, comprising:
   a circuit board;
   a first component arranged on a surface of the circuit board and fastened thereon;
   a base element, which has a first surface and a second surface opposite the latter, and which is arranged with the first surface lying on the surface of the circuit board and fastened thereon;
   a second component, which is fastened on the base element and is electrically connected via the base element to the circuit board; and
   a protective compound, which is arranged on the surface of the circuit board and encapsulates the first component,
   wherein the base element is partially embedded in the protective compound in such a way that lateral faces of the base element are covered by the protective compound and the second surface of the base element protrudes in an exposed fashion from the protective compound,
   wherein the second component has electrical terminals,
   wherein the base element has electrical terminal elements which are electrically connected to electrically conductive structures on the circuit board,
   wherein the electrical terminals are electrically connected to the electrical terminal elements, and
   wherein the electrical terminals are welded to the electrical terminal elements.

2. The electronic module as claimed in claim 1, wherein the base element is a part that is surface-mounted on the circuit board.

3. The electronic module as claimed in claim 1, wherein the first component and the base element have similar sizes such that the first component and the base element are configured to be fitted on the circuit board by one and the same applicator machine.

4. The electronic module as claimed in claim 1, wherein the second component is a sensor, a plug, or a further module having terminal contacts.

5. The electronic module as claimed in claim 1, wherein the protective compound is a coating, an encapsulation compound, a molding compound, or a resin.

6. The electronic module as claimed in claim 5, wherein the protective compound consists of a thermosetting material.

7. An electronic module, comprising:
   a circuit board;
   a first component arranged on a surface of the circuit board and fastened thereon;
   a base element, which has a first surface and a second surface opposite the latter, and which is arranged with the first surface lying on the surface of the circuit board and fastened thereon;
   a second component, which is fastened on the base element and is electrically connected via the base element to the circuit board; and
   a protective compound, which is arranged on the surface of the circuit board and encapsulates the first component,
   wherein the base element is partially embedded in the protective compound in such a way that lateral faces of the base element are covered by the protective compound and the second surface of the base element protrudes in an exposed fashion from the protective compound,
   wherein the second component has electrical terminals,
   wherein the base element has electrical terminal elements which are electrically connected to electrically conductive structures on the circuit board,
   wherein the electrical terminals are electrically connected to the electrical terminal elements, and
   wherein a connection position, at which the electrical terminals are connected to the electrical terminal elements, is encapsulated.

8. The electronic module as claimed in claim 7, wherein the base element is a part that is surface-mounted on the circuit board.

9. The electronic module as claimed in claim 7, wherein the first component and the base element have similar sizes such that the first component and the base element are configured to be fitted on the circuit board by one and the same applicator machine.

10. The electronic module as claimed in claim 7, wherein the second component is a sensor, a plug, or a further module having terminal contacts.

11. The electronic module as claimed in claim 7, wherein the protective compound is a coating, an encapsulation compound, a molding compound, or a resin.

12. A method for producing an electronic module, comprising:
    arranging a first component on a surface of a circuit board;
    arranging a base element, which has a first surface and a second surface opposite the first surface, with the first surface on the surface of the circuit board;
    arranging a second component on the base element; and
    embedding the first component into a protective compound in such a way that the first component is encapsulated in the protective compound,
    wherein, with the embedding of the first component, the base element is also partially embedded into the protective compound in such a way that lateral faces of the base element are covered by the protective compound and the second surface of the base element protrudes in an exposed fashion from the protective compound,
    wherein the second component has electrical terminals,
    wherein the base element has electrical terminal elements which are electrically connected to electrically conductive structures on the circuit board, and
    wherein the electrical terminals are welded to the electrical terminal elements.

13. The method as claimed in claim 12, wherein the embedding is carried out by a dispensing process.

14. The method as claimed in claim 12, wherein the base element and the second electrical component are mechanically fastened to one another irreversibly.

15. The method as claimed in claim 14, wherein the base element and the second electrical component are mechanically fastened to one another irreversibly by one or more of adhesive bonding, hot caulking, and a compression connection.

* * * * *